United States Patent [19]
Konno

[11] Patent Number: 5,574,792
[45] Date of Patent: Nov. 12, 1996

[54] VOLUME AND TONE CONTROL CIRCUIT FOR ACOUSTIC REPRODUCTION SETS

[75] Inventor: Fumiyasu Konno, Hirakata, Japan

[73] Assignee: Matsushita Electric Industrial Co., Ltd., Osaka, Japan

[21] Appl. No.: 291,847

[22] Filed: Aug. 17, 1994

[30] Foreign Application Priority Data

Aug. 18, 1993 [JP] Japan .................................. 5-203953

[51] Int. Cl.⁶ ...................................................... H03G 5/00
[52] U.S. Cl. ........................... 381/103; 381/101; 381/102; 381/104
[58] Field of Search ............................. 381/102, 98, 101, 381/104, 103; 455/233.1

[56] References Cited

U.S. PATENT DOCUMENTS

| | | | |
|---|---|---|---|
| 2,837,635 | 6/1958 | Epperson | 455/233.1 |
| 4,227,048 | 10/1980 | Nagata | 381/101 |
| 5,127,058 | 6/1992 | Yamasaki | 381/102 |
| 5,371,803 | 12/1994 | Williamson | 381/101 |

FOREIGN PATENT DOCUMENTS 2040627  8/1980  United Kingdom .................. 381/102

*Primary Examiner*—Curtis Kuntz
*Assistant Examiner*—Minsun Oh
*Attorney, Agent, or Firm*—McDermott, Will & Emery

[57] ABSTRACT

The invention is a volume and tone control circuit for audio sets which will not distort a signal when the volume is adjusted to maximum regardless of the tone. The circuit has a volume control in the form of a variable resistor with an intermediate fixed terminal, one end connected to an input terminal, the other end grounded, and a movable contact connected to an output terminal; an attenuation circuit connected to said input terminal; and, a tone control circuit connected between the output of said attenuation circuit and the intermediate fixed terminal. The degree of attenuation of the attenuation circuit is set so that the maximum gain of the attenuation circuit and the tone control circuit does not exceed 1. The position of the intermediate fixed terminal is determined so that amplitude-versus-frequency characteristics of the output signal become flat when the movable contact of volume control is set to maximum. The circuit will not distort a signal even at maximum volume, maintaining maximum gain of low and high pitched sounds.

9 Claims, 13 Drawing Sheets

VOLUME AND TONE CONTROL CIRCUIT FOR ACOUSTIC REPRODUCTION SETS

BACKGROUND OF THE INVENTION

The present invention relates to volume and tone control circuits for use in acoustic reproduction (audio) sets, wherein an output signal will not get distorted when the volume is adjusted to its maximum independent of the adjustment of the tone control.

One channel of a conventional volume and tone control circuit for an audio device is illustrated in FIG. 13. The variable resistor 109 is used to adjust the volume or amplitude of the audio signal appearing at input terminal 108 and fed to the tone control circuit 110. The tone control circuit is used to adjust the amplitude-versus-frequency characteristics of the signal. The adjusted signal appears at the output terminal 111. If the tone control 110 is adjusted to provide a flat response or uniform gain across the band of audio frequencies, the amplitude of the signal appearing at the output terminal 111 will be maximum or loudest when the volume control 109 is adjusted to the maximum.

The volume and tone control circuit shown in FIG. 13 is not without problems in that adjusting the volume control to its maximum may result in a distorted signal.

For example, if a listener desires to amplify or raise the bass (low frequency sound portion of the signal), the tone control is adjusted to boost the bass and attenuate the treble (high frequency sound portion of the signal) or just boost the bass portion of the signal. Then if the volume is adjusted to increase the volume or amplitude of the signal, the signal may become distorted because increasing the volume may clip the amplitude of the low frequency (bass) portion of the signal that was raised by the tone control. It should be apparent that if the tone control 110 is adjusted to flat or level gain and the volume control is not adjusted to its maximum, there is less likelihood that the amplitude of the signal will be high enough to be clipped. Of course, by keeping the low range of frequencies below their maximum level and the volume control below its maximum level, the high range of frequencies will operate below the maximum level.

Another problem with the volume and tone control circuit shown in FIG. 13 arises when a listener desires to attenuate or lower the level of the low range of frequencies. If the tone control 110 is adjusted to attenuate the bass level, then adjusting the volume control 109 to its maximum will provide a signal that is below the maximum level attainable.

The same problems described above are also applicable to the situations when the listener wants to adjust the treble or high frequency sound band to its maximum or to attenuate the treble and then adjust the volume control.

In particular, if a listener increases the bass and/or treble to a maximum level, then an adjustment of the volume control to its maximum level may clip the signal and result in a distorted signal. On the other hand, if the bass and/or treble are attenuated, then a maximum signal is not achievable by adjusting the volume control to its maximum, since the signal has been attenuated by the tone control.

SUMMARY OF THE INVENTION

According to the invention, a volume and tone control circuit is provided that will not clip an audio signal when the volume control is adjusted to its maximum even if the tone control is adjusted to its maximum.

The volume and tone control circuit comprises a variable resistor having one end thereof connected to an input terminal for receiving an audio signal and the other end connected to ground. Also, the variable resistor has a movable control connected to an output terminal and an intermediate fixed terminal. The input of an attenuation circuit is connected to said input terminal. A tone control circuit is connected between the output of said attenuation circuit and said intermediate fixed terminal. The parameters of the attenuation circuit and tone control are set so that the maximum amplification of the signal passing through the attenuation and tone control circuits does not exceed 1 (not to exceed 0 dB) over the entire audio frequency band.

The attenuation circuit can be a resistive voltage divider. However, an operational amplifier may be added between the attenuation circuit and the tone control circuit to stabilize the input impedance of the tone control circuit. The tone control portion of the circuit can vary in complexity. The tone control can be an RC type circuit, an input parallel voltage feedback type circuit, a graphic equalizer or a parametric equalizer.

The position of the intermediate terminal of said variable resistor is fixed at a point that results in the amplitude-versus-frequency characteristics of the output signal being flat when the movable contact of the volume control is set at maximum volume, independent of the settings of the tone control portion of the circuit.

The hereinafter described volume and tone control circuit has the advantage of providing the same tone control function as conventional tone controls at low and medium volume settings. However, as volume is increased, the influence of boosting the tone by the tone control circuit is less and less, since the circuit of the present invention provides the excellent advantage of providing an audio signal with amplitude-versus-frequency characteristics that become flat at maximum volume. Accordingly, even if the volume is set at maximum and the low (bass) and high (treble) pitched sound bands are set at maximum, distortion is not introduced into the signal through clipping. As long as the input signal is not clipped, no clipping will be introduced by adjusting the tone control circuit to its maximum setting.

The invention itself, together with further objects and attendant advantages, will best be understood by reference to the following detailed description, taken in conjunction with the accompanying drawings.

DETAILED DESCRIPTION OF THE EMBODIMENTS

Figure 1:
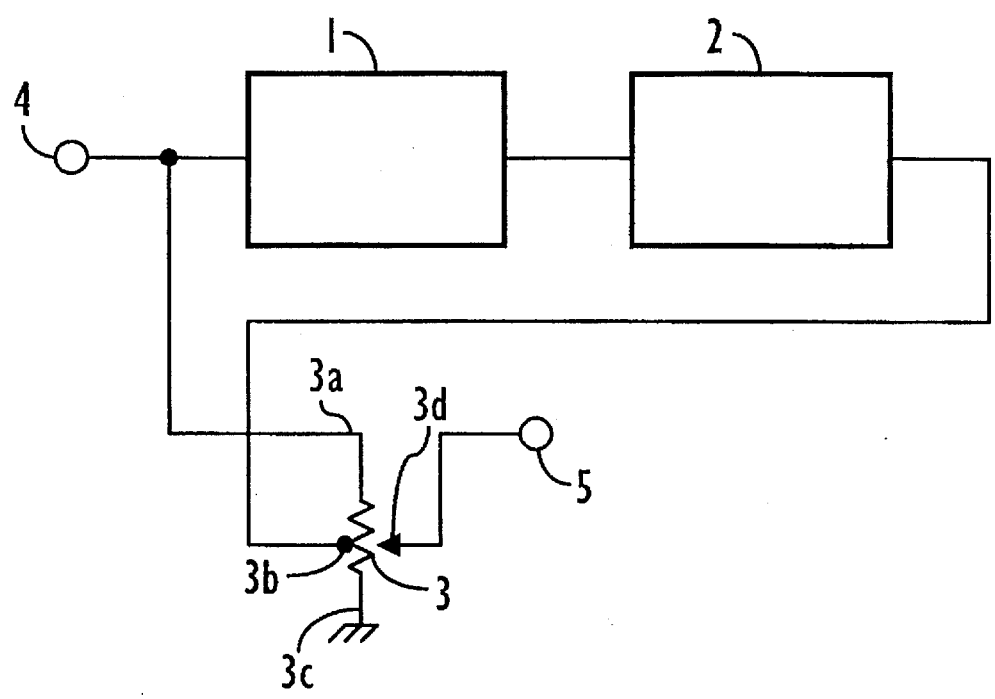
FIG. 1 is a block diagram showing the basic circuit structure of a volume and tone control circuit of the present invention for an audio device.

Turning now to the drawings, FIG. 1 shows a block diagram of the basic circuit structure of the volume and tone control circuit of this invention for use in audio devices.

FIG. 1 shows an attenuation circuit 1 having an input and an output, a tone control circuit 2 having an input and an output, and a volume control circuit having a variable resistor 3 including an intermediate fixed terminal 3b, a sliding or movable contact 3d, and two terminals 3a, 3c at either end of the variable resistor 3. An input terminal 4 is connected to the input of the attenuation circuit 1, and the output of the attenuation circuit is connected to the input of the tone control circuit 2. The input terminal 4 is also connected to one terminal 3a of the volume control variable resistor 3. The other terminal 3c is grounded. The movable contact 3d is connected to an output terminal 5. The intermediate fixed terminal 3b is connected to the output of the tone control circuit 2. The output of the volume and tone control circuit is the output terminal 5.

Various types of tone control circuits can be used for tone control circuits in the block diagram illustrated in FIG. 1, according to the invention. Five such circuits are disclosed.

The details of the attenuation and the tone control portions of the circuit are described below.

First Embodiment

Figure 2:
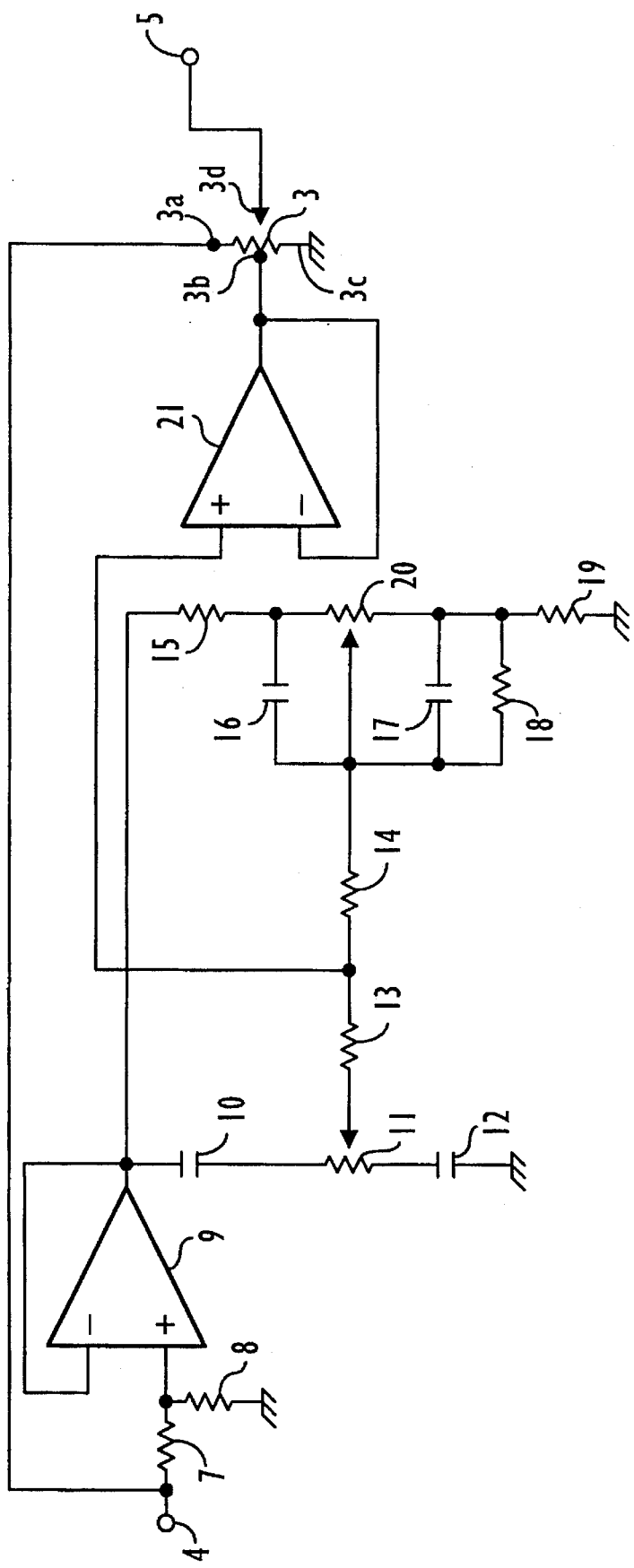
FIG. 2 is a circuit diagram of a volume and an RC type-tone control circuit according to the first embodiment of the present invention.

In FIG. 2, an RC (resistance-capacitance) type circuit is used as the tone control circuit 2 in the basic circuit structure shown in FIG. 1.

The attenuation circuit 1 shown in FIG. 1 comprises a resistance voltage divider having resistors 7, 8 and an operational amplifier 9. The operational amplifier, with its very low output impedance characteristic, acts as a stable working of the tone control circuit by preventing the influence of low impedance fluctuations of the attenuation circuit on the tone control circuit 2.

The RC type tone control circuit comprises an operational amplifier 21, resistors 13, 14, 15, 18, 19, capacitors 10, 12, 16, 17, and two variable resistors 11, 20. The variable resistor 11 is used for boosting or attenuating the amplitude of the high (treble) frequency sound range. The variable resistor 20 is used for boosting or attenuating the amplitude of the low (bass) frequency sound range.

The output of the operational amplifier 21 is connected to the intermediate fixed terminal 3b of the variable resistor 3. One terminal 3a is connected to the input terminal 4. The other terminal 3c is grounded. The output 5 is connected to the movable contact 3d.

The portion of the intermediate terminal 3b, in this embodiment and the ensuing embodiments, is determined by considering the input impedance and the load impedance connectable to the output terminal 5 so that the amplitude-versus-frequency characteristics of the output audio signal appearing at terminal 5 will remain flat when the volume control is set at maximum and the tone control is adjusted to its maximum settings. Overall, the parameters of the circuit are selected so that the maximum amplification of the output signal will not exceed 0 dB (amplification degree 1 or Gain 1).

The characteristics of the output signal are shown in FIGS. 3 through 6.

Figure 3:
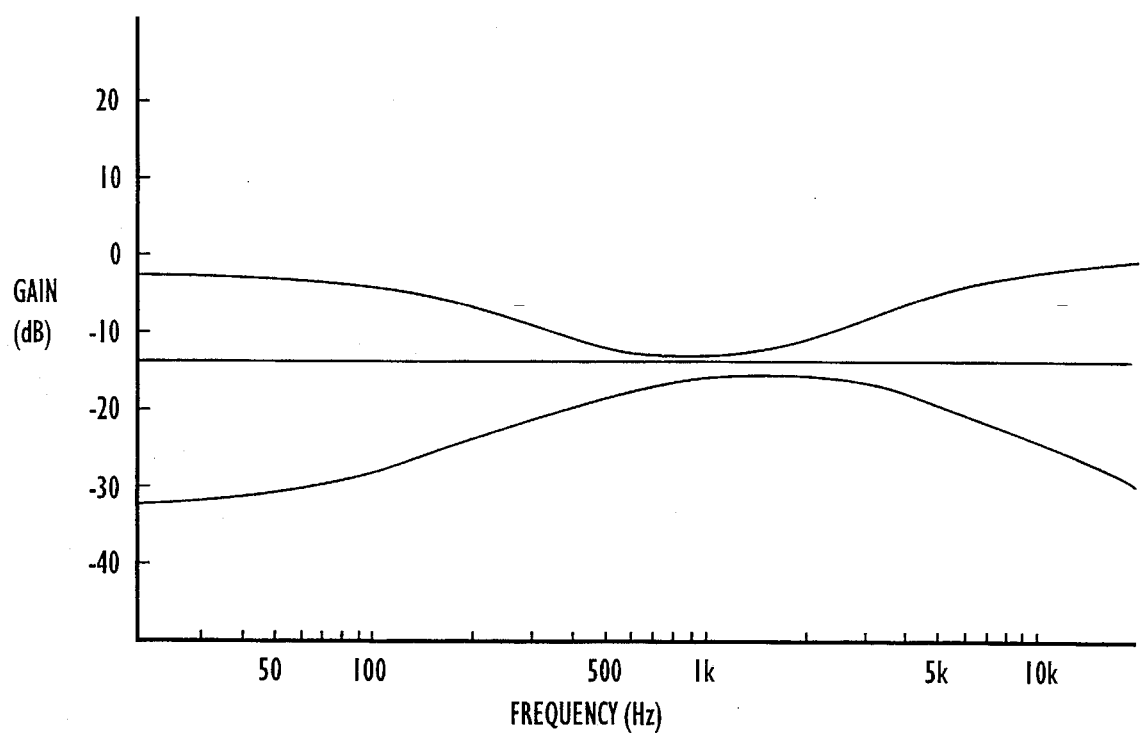
FIG. 3 shows amplitude-frequency plots of the output of the tone control circuit according to the first, second and third embodiments of the invention when the bass and treble settings are set at the maximum, flat and minimum settings.

FIG. 3 shows the voltage (amplitude)-versus-frequency characteristics of the output signal of the operational amplifier 21 for three different settings of the variable resistors 11, 20. The parameters of the circuit are selected so that the amplitude of the signal provided by the amplifier 21 does not exceed 0 dB. As a result, the signal provided by the amplifier 21 will not get clipped.

In particular, the lowest curve appearing in FIG. 3 represents the amplitude-versus-frequency characteristics of the amplifier 21 output signal when the bass and treble are attenuated. Specifically, the variable resistor 20 is moved to its lowest setting to attenuate the low pitched sound range and the variable resistor 11 is moved to its lowest setting to attenuate the high pitched sound range. The middle curve represents the output signal when the resistors 11, 20 are set to provide a level or flat gain. The highest curve represents the amplitude-versus-frequency of the output signal when the bass and treble settings are set at their maximum by the variable resistors 11, 20. This curve does not exceed 0 dB.

With the variable resistors 11, 20 set at their maximum positions, no distortion should be introduced into the amplifier 21 output signal if the volume of the signal is increased to its maximum level by moving the movable contact 3d to its maximum setting. More importantly, with the bass, treble and volume settings all at maximum, the output signal provided to terminal 5 will have a level gain not exceeding 0 dB. This can be observed by turning to FIG. 4.

Figure 4:
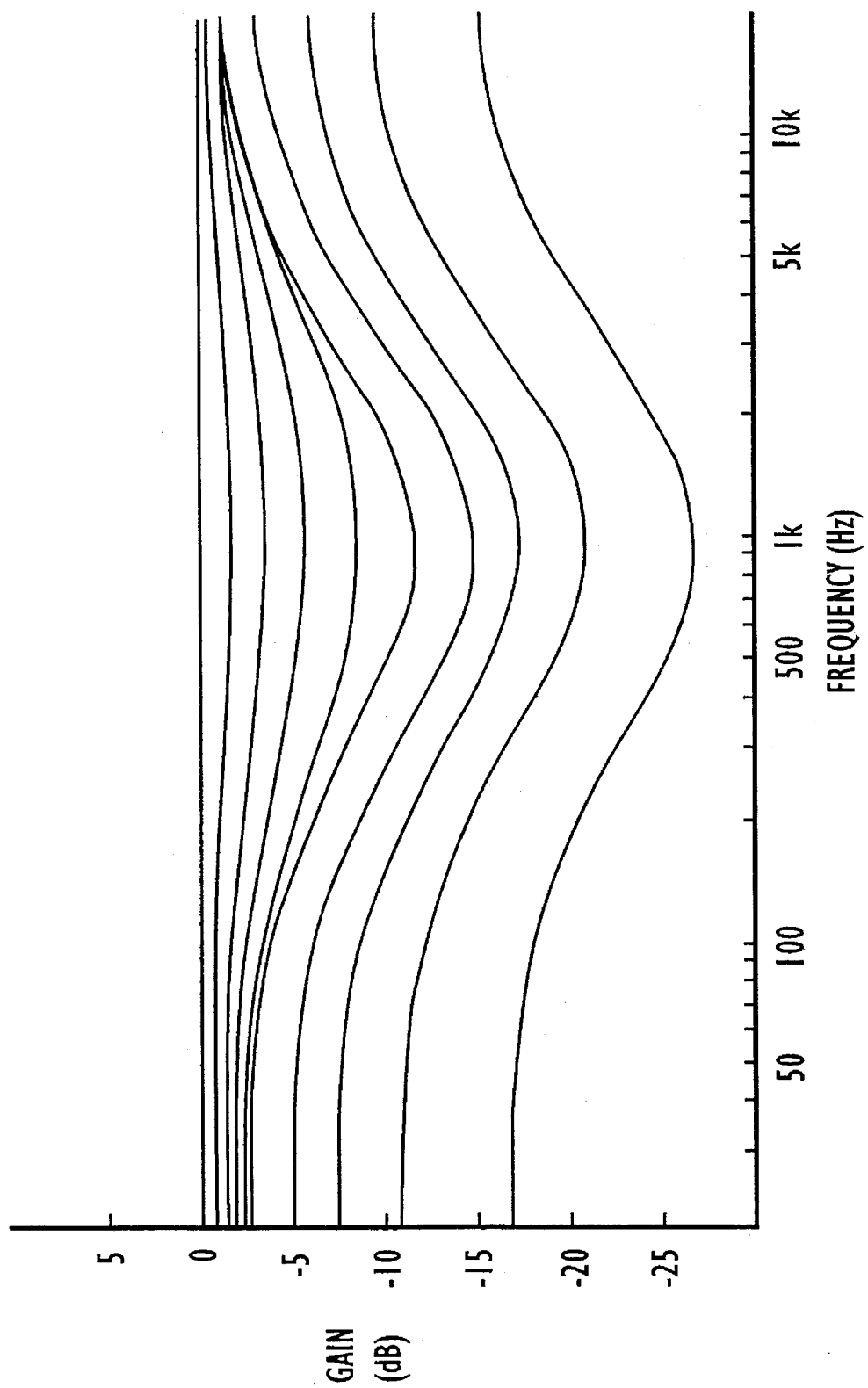
FIG. 4 shows amplitude-frequency plots of the circuit output corresponding to changes in the volume control when the bass and treble settings in the tone control circuit, according to the first, second or third embodiment, are set at maximum.

FIG. 4 shows a number of curves obtained by setting the variable resistors 11, 20 to their maximum positions and positioning the movable contact 3d at various points along the variable resistor 3. Each plot represents the amplitude-versus-frequency characteristics of the output signal fed to terminal 5 when both the low and high pitched sound controls 11, 20 are set at maximum, and the movable contact 3d is moved little by little. The highest curve shows that the amplitude-versus-frequency characteristics of the output signal, with all these settings at maximum, is flat.

The advantage of the volume and tone control circuit described above under the First Embodiment is that no distortion is introduced to the output signal when the bass, treble and volume controls are at their respective maximum settings. When the movable contact 3d is set at maximum volume, the amplitude-versus-frequency characteristics become flat, and is independent of settings of the tone control circuit. This independent relationship is determined by the parameters of the input impedance, the position of the intermediate fixed terminal 3b, and the load resistance connected to the output terminal 5.

Figure 5:
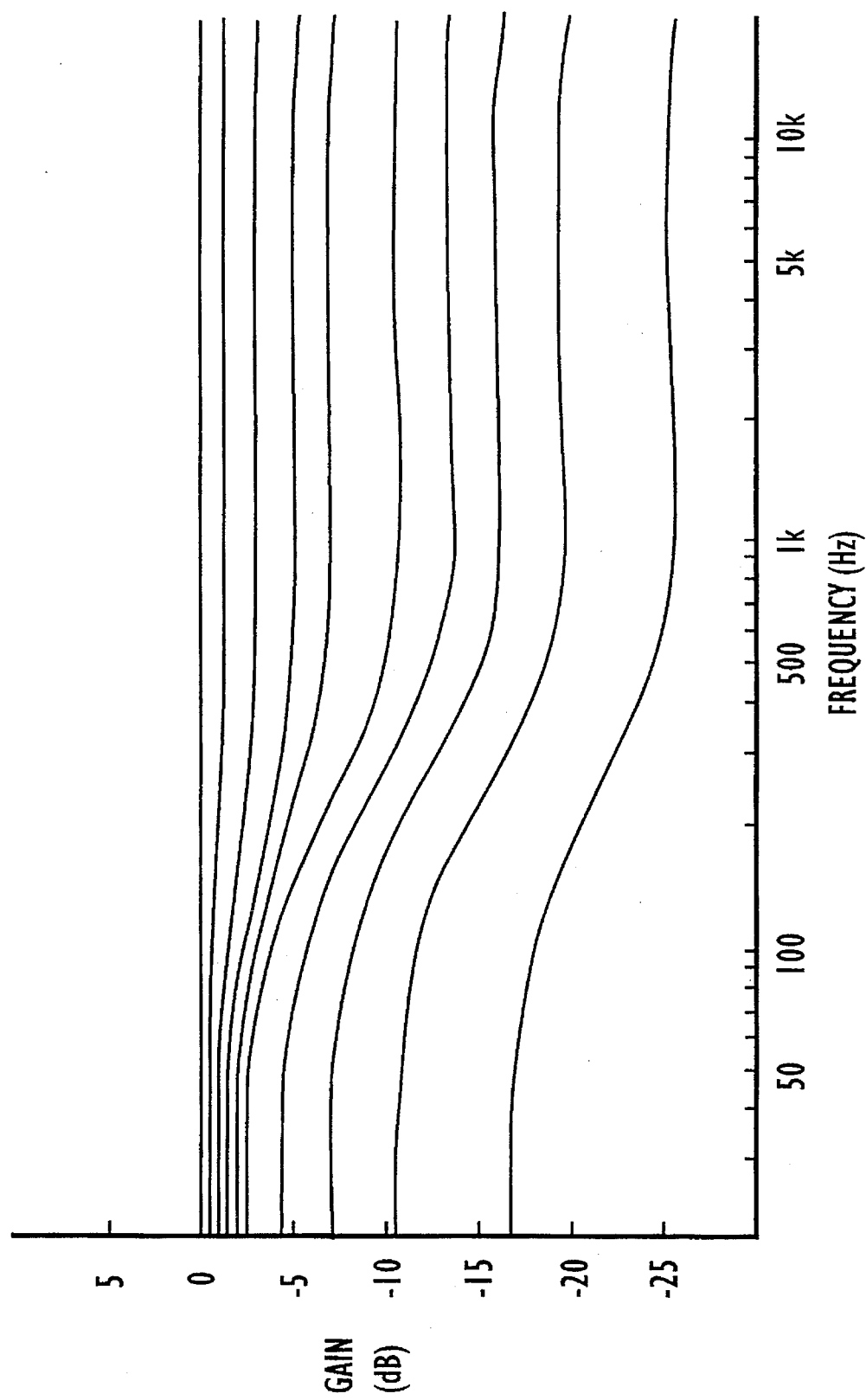
FIG. 5 shows amplitude-frequency plots corresponding to changes in the volume control when the bass setting in the tone control circuit according to the first, second or third embodiments is set at maximum.
Figure 6:
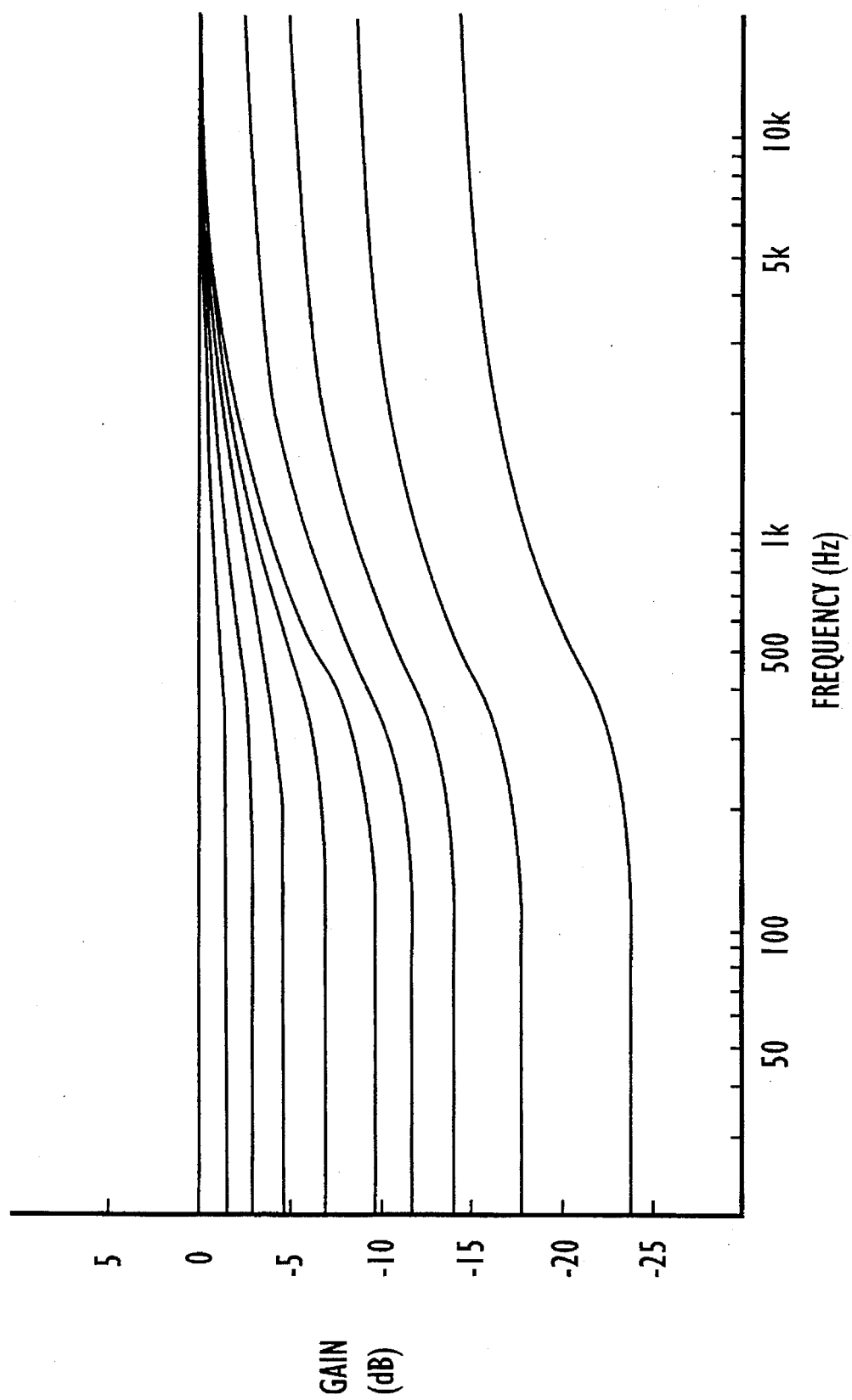
FIG. 6 shows amplitude-frequency plots corresponding to changes in the volume control when the treble setting in the tone control circuit according to the first, second or third embodiment is set at maximum.

FIGS. 5 and 6 show the amplitude-versus-frequency characteristics when the volume control is varied little by little and either the bass or treble controls are set to maximum.

In particular, FIG. 5 shows the plots of amplitude-versus-frequency of the output signal when the variable resistor 20 is set to maximum and the movable contact 3d is varied little by little. FIG. 6 shows the plots of amplitude-versus-frequency of the output signal when the variable resistor 11 is set to maximum and the movable contact 3d is moved little by little. The highest curve in each of the Figures shows that no distortion is introduced into the output signal since the characteristics of the curves are flat.

Second Embodiment

Figure 7:
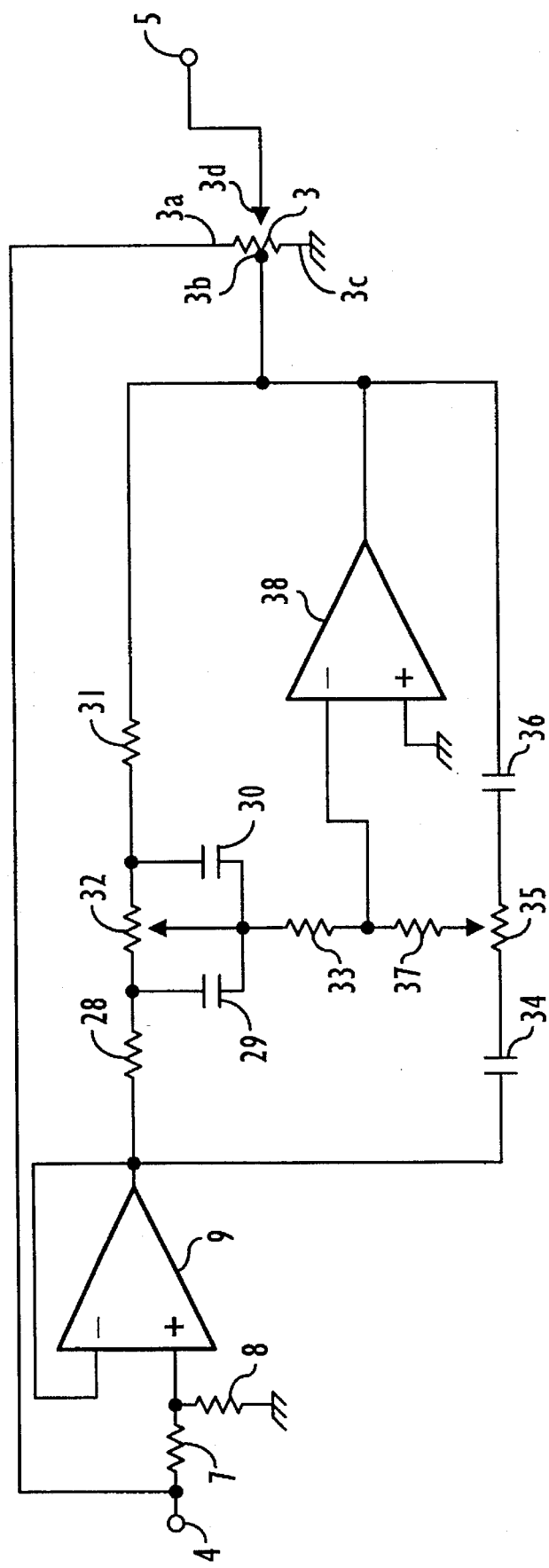
FIG. 7 is a circuit diagram of a volume and a parallel input voltage feedback type-tone control circuit according to the second embodiment of the present invention.

In FIG. 7, an input parallel voltage feedback type circuit is used on the tone control circuit 2 in the basic circuit structure shown in FIG. 1.

The attenuation circuit 1 shown in FIG. 7 comprises resistors 7, 8 and an operational amplifier 9. The tone control circuit 2 comprises resistors 28, 31, 33, 37, capacitors 29, 30, 34, 36, variable resistors 32, 35 for controlling the bass and treble, respectively, and an operational amplifier 38. One terminal 3a of the volume control variable resistor 3 is connected to input 4. The intermediate fixed terminal 3b is connected to receive the signals passed through the attenuation circuit and tone control circuit. The characteristics using this type of tone circuit are the same as those provided by the circuit described in the first embodiment. Hence, the detailed description of the second embodiment is omitted.

Third Embodiment

Figure 8:
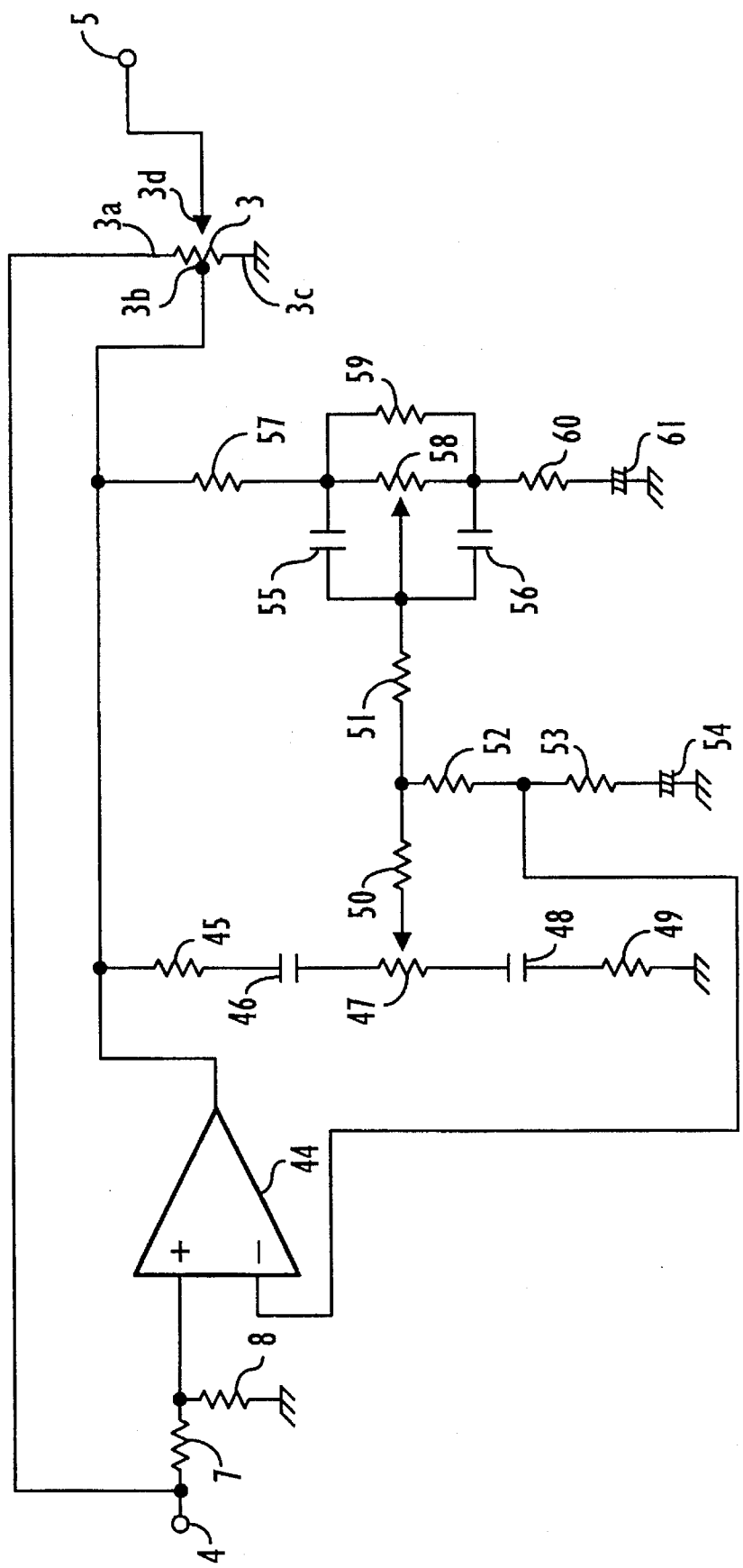
FIG. 8 is a circuit diagram of a volume and a input series voltage type-feedback type-tone control circuit according to the third embodiment of the present invention.

In FIG. 8, an input series voltage feedback type circuit is used as the tone control circuit 2 in the basic circuit structure shown in FIG. 1.

The attenuation circuit 1 in FIG. 1 comprises resistors 7, 8. The tone control circuit 2 comprises an operational amplifier 44, resistors 45, 49, 50, 51, 52, 53, 57, 59, 60, capacitors 46, 48, 54, 55, 56, 61, and variable resistors 47, 58 for controlling the treble and bass, respectively. The intermediate terminal 3b is connected to receive the signals passed through the attenuation circuit and the tone control circuit. Since the characteristics using this type of tone control circuit are the same as those provided by the circuit described in the first embodiment, the detailed description of the third embodiment is omitted.

Fourth Embodiment

Figure 9:
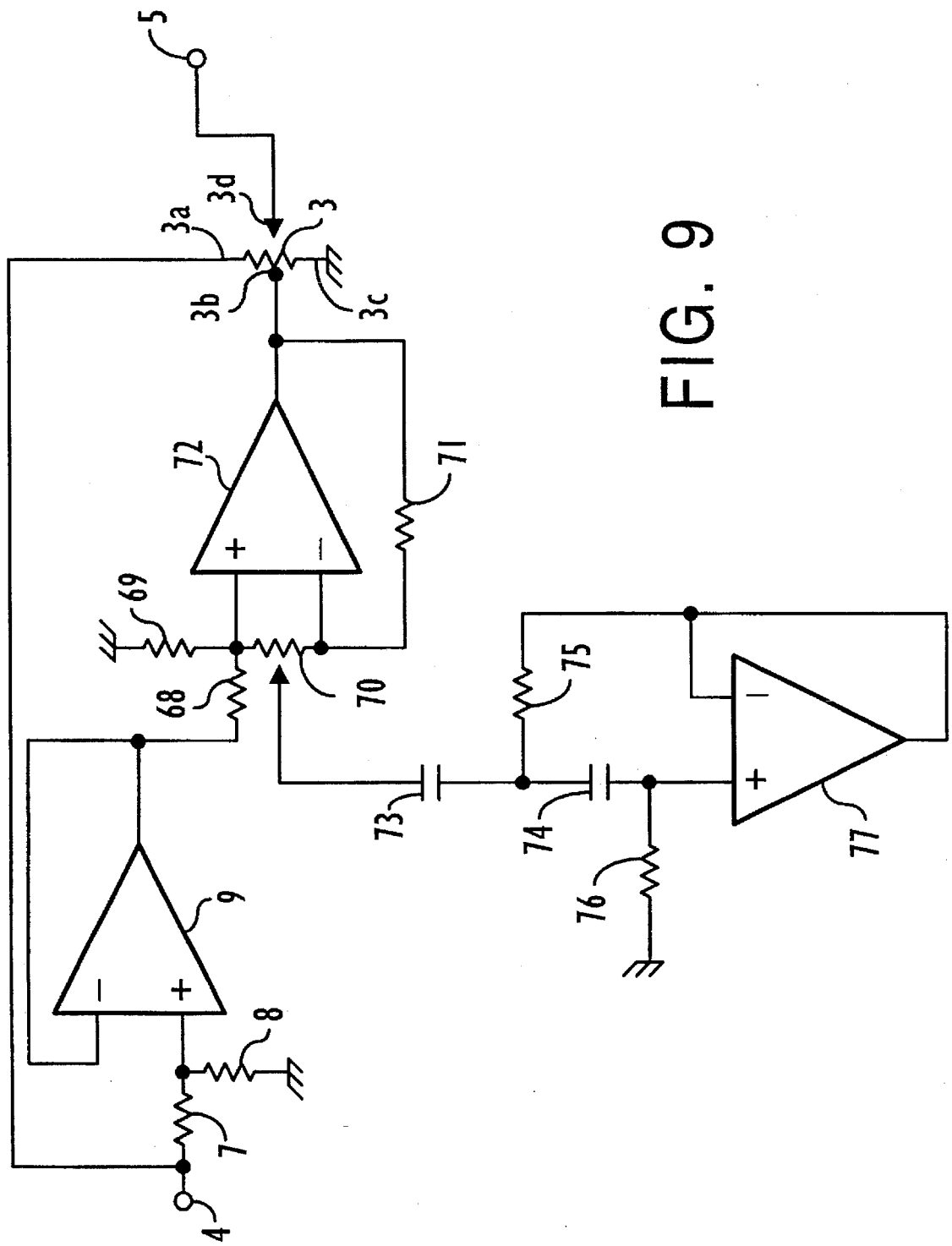
FIG. 9 is a circuit diagram of a volume and a graphic equalizer type-tone control circuit according to the fourth embodiment of the present invention.

In FIG. 9, a graphic equalizer is used as the tone control circuit 2 in the basic circuit structure shown in FIG. 1.

The attenuation circuit 1 in FIG. 1 comprises resistors 7, 8, and an operational amplifier 9. The tone control circuit 2 of the fourth embodiment comprises a graphic equalizer.

A graphic equalizer controls the gain at a different frequencies. The equalizer shown in FIG. 9 controls the bass/treble at one frequency. The discrete frequency has a center frequency as set by an LC (inductance-capacitance) resonance circuit comprising a semiconductor inductor formed of an operational amplifier 77, a capacitor 74, and resistors 75, 76. The amplitude (bass/treble) of the center frequency is adjusted by the circuit comprising an operational amplifier 72, resistors 68, 69, 71, and a variable resistor 70. A capacitor 73 connects the range setting circuit to the adjustment portions of the circuit.

The adjustment of the amplitude-versus-frequency characteristics within the discrete frequency is performed by adjusting the variable resistor 70. The resistor 70 controls the increase/decrease in the level of amplitude at the center frequency set by the LC current.

Different center frequencies are obtainable by changing the time constant of the LC resonance circuit. The circuit in FIG. 9 shows only one LC resonance circuit with one time constant for one center frequency. In order to cover other frequencies, a number of graphic equalizer circuits have to be used. The number of graphic equalizer circuits needed is equal to the number of center frequencies that need to be covered. A different variable resistor 70 will control the gain of each center frequency.

Figure 10:
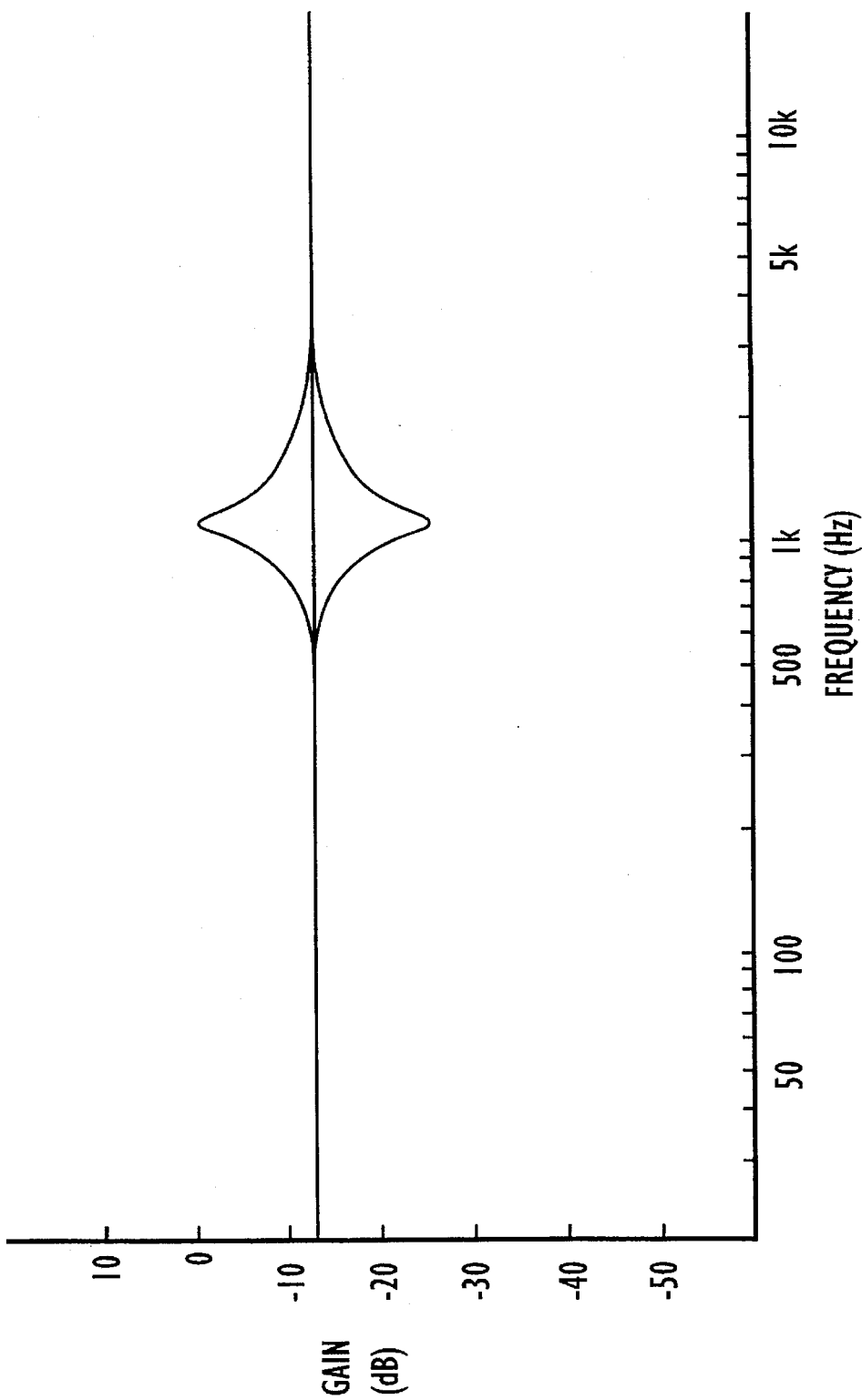
FIG. 10 shows amplitude-frequency plots of the tone control circuit according to the fourth and fifth embodiments of the invention when the bass and treble settings are set at the minimum, flat and minimum settings.
Figure 11:
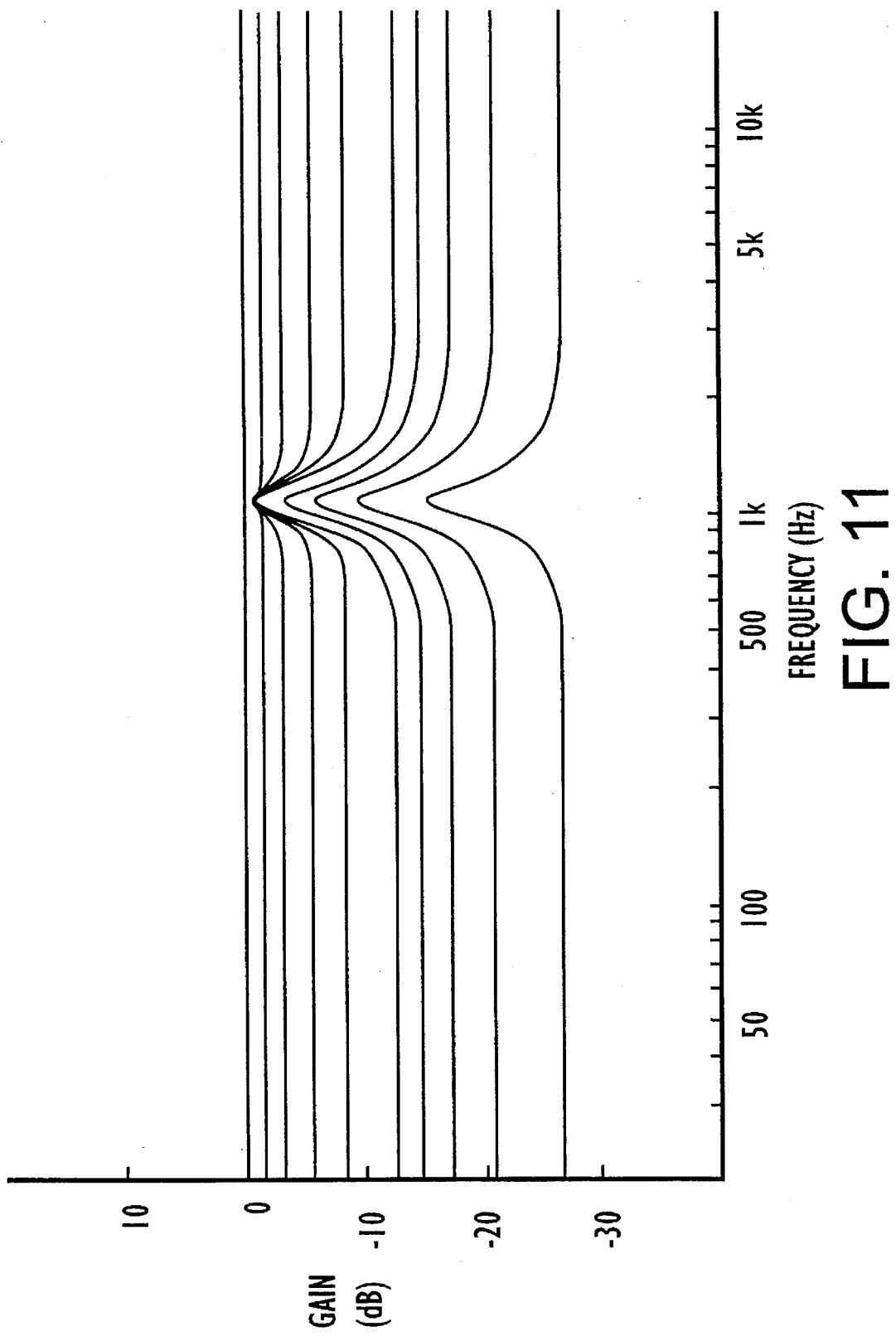
FIG. 11 shows amplitude-frequency plots of the circuit output corresponding to changes in the volume control when the bass and treble settings in the tone circuit, according to the fourth and fifth embodiment, are set at maximum.

To illustrate the characteristics of using a graphic equalizer as the tone control circuit, turn to FIGS. 10 and 11.

FIG. 10 shows three curves representing the amplitude-versus-frequency characteristics of the output signal being provided to the intermediate terminal 3b with the variable resistor set at maximum gain, flat and minimum attenuation. In particular, with the variable resistor 70 set at maximum, the amplitude-versus-frequency characteristics do not exceed 0 dB at the discrete center frequency set by the LC resonance circuit. With the resistor 70 set at flat, the middle curve shows the amplitude-versus-frequency characteristics to be flat. Lastly, the lowest curve represents the conditions with the variable resistor set to its lowest setting.

Just as the circuits described in the first, second and third embodiment, the volume and control circuit is designed so that the output signal does not exceed 0 dB (Gain 1). As a result, adjusting the variable resistor 70 to its maximum level will not produce a clipped or distorted signal.

FIG. 11 shows the effect of varying the volume control 3d when the variable resistor is set at its maximum setting. When the volume control 3d is changed little by little up to its maximum setting, the signal provided to the output terminal 5 remains distortionless. No clipping is introduced to the output signal. More importantly, the signal flattens out at the maximum volume setting.

Fifth Embodiment

Figure 12:
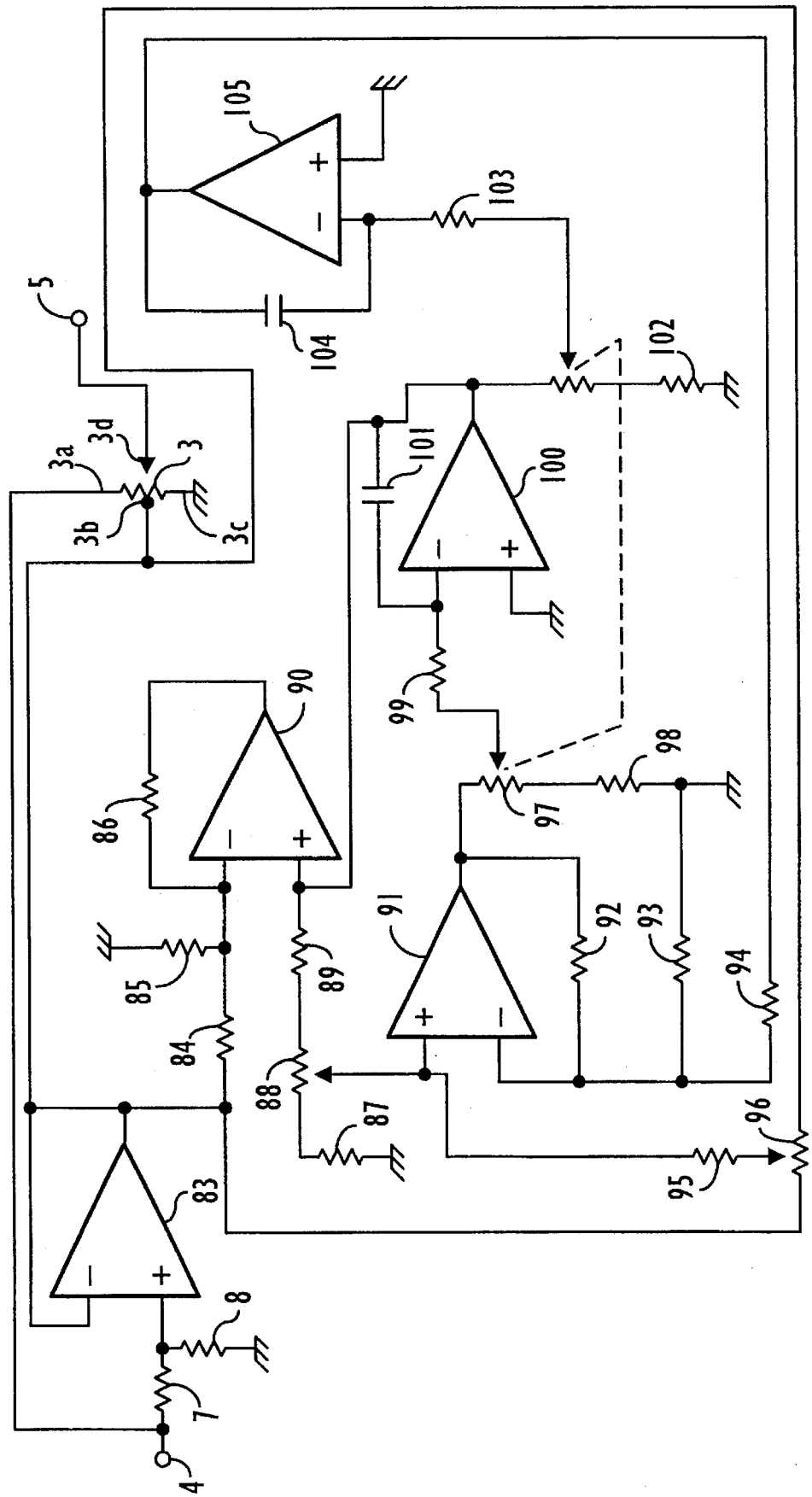
FIG. 12 is a circuit diagram of a volume and a parametric equalizer type-tone control circuit according to the fifth embodiment of the present invention.
Figure 13:
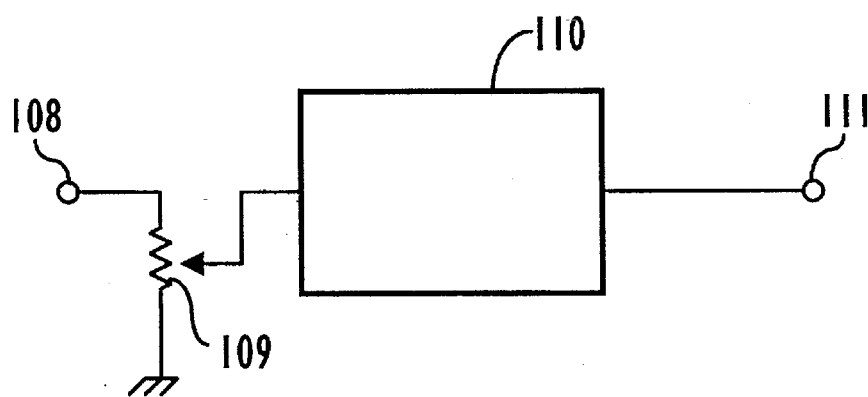
FIG. 13 is a block diagram of a conventional volume and tone control circuit of an audio device.

The volume and tone control circuit shown in FIG. 12 is similar to the circuit described as the Fourth Embodiment.

In FIG. 12, a parametric equalizer is used as the tone control circuit 2 in the basic circuit structure shown in FIG. 1.

The attenuation circuit 1 in FIG. 1 comprises a resistance voltage divider comprising resistors 7, 8. The tone control circuit 2 in FIG. 1 comprises operational amplifiers 83, 90, 91, 00, 105, resistors 84, 85, 86, 87, 89, 92, 93, 94, 95, 98, 99, 102, 103, capacitors 101, 104, variable resistors 88, 96, and an interlocked variable resistor 97.

Just as in the case of the circuit shown in FIG. 9, the circuit shown in FIG. 12 covers only one discrete frequency.

The sharpness of the resonance (Q) at the desired frequency is controlled by the variable resistor 88. The adjustment of the tone is controlled by the variable resistor 96. The center frequency is set by the variable resistor 97. The output of the parametric equalizer is connected to the intermediate fixed terminal 3b of the variable resistor 3. The same amplitude-versus-frequency characteristics as shown for the fourth embodiment are obtainable with the parametric equalizer, and the detailed description is omitted.

The fifth embodiment is described relative to one center frequency. However, a plurality of center frequencies are generally employed, and hence, it should be apparent that the number of parametric equalizer circuits needed would correspond to number of center frequencies employed.

The embodiments described above use a tone control circuit that includes an attenuation circuit, both of which are designed to provide an audio signal not to exceed 0 dB (amplification degree 1).

The embodiments described above provide a number of significant advantages.

A volume control circuit in the form of a variable resistor with an intermediate fixed terminal that receives the output signal from the tone control circuit provides a flat distortionless signal when adjusted to its maximum setting.

The tone control can be adjusted to its maximum setting and the volume control can be adjusted to its maximum setting and the resulting signal will not be distorted.

The volume and tone control circuit of the present invention provides distortionless signals the same as conventional volume and tone control circuit in the low and middle volume ranges. However, the significant advantage of the present invention is that when volume is increased to its maximum, the characteristics of the amplitude-versus-frequency of the output become flat. Therefore, the volume and tone circuit will not clip even at maximum volume maintaining maximum gain of the low and high pitched sounds. Moreover, since tone can be controlled at respective center frequency points, the circuit works as the same as an auto-loudness circuit when fixed in a certain frequency. Further, since the total amplification of the attenuation circuit and the tone control circuit will not exceed 0 dB (amplification degree 1) over the whole audio frequency band, no distortion by clipping a signal will occur in the tone control circuit.

As long as the input signal is not clipped, the volume and tone control circuit according to the present invention has the advantage of not clipping and distorting the signal when the tone and volume control are adjusted to their maximum settings.

The present invention is applicable to car radios, compact disc players, cassette recorders' speakers, stereo receivers, etc.

Of course, it should be understood that a wide range of changes and modifications can be made to the preferred embodiment described above. It is therefore intended that the foregoing detailed description be regarded as illustrative rather than limiting, and that it be understood that it is the following claims, including all equivalents, which are intended to define the scope of this invention.

What is claimed is:

1. A volume and tone control circuit for an audio device comprising:

an input terminal and an output terminal;

a variable resistor having an intermediate fixed terminal, one end connected to said input terminal, the other end connectable to ground, and a movable contact connected to said output terminal;

an attenuation circuit connected to said input terminal; and a tone control circuit connected between the output of said attenuation circuit and said intermediate fixed terminal, wherein the position of said intermediate fixed terminal of said variable resistor is determined so that amplitude-versus-frequency characteristics of an output signal provided become flat over the entire audio frequency band at the maximum volume settings of the movable contact, regardless of the setting of said tone control circuit.

2. The volume and tone control circuit of claim 1, wherein attenuation of said attenuation circuit is set so that the maximum gain of the combination of said attenuation circuit and said tone control circuit does not exceed 1 over the audio frequency band.

3. The volume and tone control circuit of claim 1, wherein RC type circuit capable of tone controlling in at least one frequency band is used as said tone control circuit.

4. The volume and tone control circuit of claim 1, wherein an input parallel voltage feedback type circuit capable of tone controlling in at least one frequency band is used as said tone control circuit.

5. The volume and tone control circuit of claim 1, wherein an input series voltage feedback type circuit capable of tone controlling in at least one frequency band is used as said tone control circuit.

6. The volume and tone control circuit of claim 1, wherein a graphic equalizer capable of tone controlling at least one center frequency is used as said tone control circuit.

7. The volume and tone control circuit of claim 1, wherein a parametric equalizer capable of tone controlling at least one center frequency is used as said tone control circuit.

8. A volume and tone control circuit for an audio device comprising;

an attenuation means for attenuating an input signal and for providing an output signal;

a tone control means for controlling amplitude-versus-frequency characteristics of said output signal from said attenuation means and for providing a tone controllable output signal;

a volume control means for adjusting the volume of said tone controllable output signal and for providing an output signal having a flat distortionless signal at a maximum setting of said volume control means regardless of the amplitude of the tone output signal, wherein when the volume of said volume control means is adjusted to its maximum setting, the characteristics of the amplitude-versus-frequency of the output signal of said volume control means are flat.

9. A volume and tone control circuit for an audio device according to claim 8, wherein the characteristics of the amplitude-versus-frequency of the output signal of said volume control means are flat when the amplitude of the tone output signal is at a maximum.

* * * * *